(12) United States Patent
Kang et al.

(10) Patent No.: US 7,733,725 B2
(45) Date of Patent: Jun. 8, 2010

(54) METHOD OF DRIVING 1-TRANSISTOR TYPE DRAM HAVING AN NMOS OVERLAIN ON TOP OF AN SOI LAYER

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 148 days.

(21) Appl. No.: 12/167,280

(22) Filed: Jul. 3, 2008

(65) Prior Publication Data
US 2009/0168574 A1 Jul. 2, 2009

(30) Foreign Application Priority Data
Jan. 2, 2008 (KR) ............... 10-2008-0000288

(51) Int. Cl.
*G11C 7/00* (2006.01)
(52) U.S. Cl. .................. 365/203; 365/149
(58) Field of Classification Search .......... 365/203, 365/149, 189.04
See application file for complete search history.

(56) References Cited

U.S. PATENT DOCUMENTS

| | | | | |
|---|---|---|---|---|
| 6,259,634 B1 * | 7/2001 | Kengeri et al. | ......... | 365/189.04 |
| 7,075,821 B2 * | 7/2006 | Ye et al. | ............ | 365/174 |
| 7,630,262 B2 * | 12/2009 | Kang et al. | ............ | 365/207 |

FOREIGN PATENT DOCUMENTS

| | | |
|---|---|---|
| KR | 100800157 B1 | 1/2008 |
| KR | 100800158 B1 | 1/2008 |
| KR | 100861187 B1 | 9/2008 |
| KR | 100861191 B1 | 9/2008 |

* cited by examiner

*Primary Examiner*—Anh Phung
(74) *Attorney, Agent, or Firm*—Ladas & Parry LLP

(57) ABSTRACT

Driving a 1-transistor DRAM composed of an NMOS on top of a SOI layer such that the 1-transistor DRAM has a corresponding parasitic bipolar transistor component includes precharging, shifting, and deactivating steps. Implementing these steps can result in enhancing the performance of reading, writing and storing binary logic information within the 1-transistor DRAM memory device.

6 Claims, 10 Drawing Sheets

STORE "1" STATE

STORE "0" STATE

METHOD OF DRIVING 1-TRANSISTOR TYPE DRAM HAVING AN NMOS OVERLAIN ON TOP OF AN SOI LAYER

CROSS-REFERENCE TO RELATED APPLICATIONS

The present application claims priority to Korean patent application number 10-2008-0000288 filed on Jan. 2, 2008, which is incorporated herein by reference in its entirety.

BACKGROUND OF THE INVENTION

The present invention relates to a semiconductor memory device, and more particularly to a method of using a 1-transistor type DRAM to store charges associated with binary states.

It is well known that dynamic random access memory (DRAM) devices can be build as integral components on silicon wafers. It is also well known that only the very top surface of these silicon wafers is where the functionally resides for these DRAM semiconductor devices. The remaining thickness of the silicon wafer is often simply used only as a physical support base. The remaining silicon wafer (excepting portions thereof necessary for the device operation) becomes the factor that increases power consumption and decreases driving speed.

It is also well known that Silicon on insulator (SOI) DRAM wafer designs have a functional thickness comparable to those of regular DRAM devices, but require about one-half the area on the chip. These SOI DRAM type devices are also referred to as single transistor ZRAMs (Zero capacitor RAM), capacitorless type DRAMs, single transistor DRAM devices, and also 1-transistor DRAM devices. These types of devices, i.e., 1-transistor DRAM devices promise to nearly double the memory access retrieval speed while using less power. It is thought that partly due to a small junction capacity thereof associated with these 1-transistor DRAM devices high-speed and low-voltage access can be realized due to a low threshold voltage thereof, as compared to a semiconductor device integrated on a general silicon wafer.

FIG. 1 is a cross-sectional view showing a DRAM cell implemented on a conventional SOI wafer. In FIG. 1, an SOI wafer 10 is shown configured as a stacked structure composed of a silicon substrate 1, a buried oxide layer 2 and a silicon layer 3. A device isolating layer 11 defining an activation region on the silicon layer 3 of the SOI wafer 10 is shown formed to adjoin the buried oxide layer 2. A gate 12 is shown formed on an upper surface of the activation region of the silicon layer 3, and the source/drain regions 13a, 13b are shown formed in the silicon layer 3 of the both sides of the gate 12 that adjoin the buried oxide layer 2.

In a DRAM cell implemented on the SOI wafer 10, residual holes and/or electrons are thought to be captured or accumulated within a floating body corresponding to the channel region beneath the gate 12. This charge residual accumulation of either these excess holes or electrons at the channel region beneath the gate 12 can be exploited as a binary scheme to store data or to store information.

For example, as shown in FIG. 2a, storing an arbitrary "1" binary state may be arbitrarily defined as a state where lots of holes are in the floating body. In contrast, as shown in FIG. 2b, storing an arbitrary "0" binary state may be arbitrarily defined as a state where less holes or an excess of electrons are accumulated within this floating body. As a result, during a read state, this excess accumulation of charges are thought to directly contribute to influencing the amount of sensing current flowing across these 1-transistor type cell in either a store "1" state or in the store "0" state.

FIG. 3 graphically depicts a read current as a function of gate voltage when the cell drain voltage Vd is maintained at approximately 0.2V while setting the cell source voltage to ground (GND) for the DRAM cell implemented on the conventional SOI wafer.

As shown, the read current is larger in the store "1" state and is smaller in the store "0" state, wherein reference current is intermediate therebetween.

In the DRAM cell implemented on the aforementioned conventional SOI wafer, there is a need for a method that is capable of effectively writing and reading the data in the low voltage state. A need also exists for a method that is capable of stably driving the 1-transistor type DRAM cell.

SUMMARY OF THE INVENTION

The present invention provides a method of driving a 1-transistor DRAM that generates a large amount of hole carriers using a low voltage state which thereby improves a write operation margin.

There is also provided a method of driving a 1-transistor DRAM (Dynamic Random Access Memory) including a NMOS (n-type Metal Oxide Semiconductor) being on top of a SOI (Silicon on Insulator) layer, the NMOS having a parasitic bipolar transistor component, the method including: precharging, during a first hold period, a source line and a bit line of the NMOS of the 1-transistor DRAM at a precharge voltage while non-activating a word line of the NMOS transistor at a ground voltage to maintain an accumulation of charge carriers within a floating channel region underneath a gate of the NMOS transistor, wherein the accumulation of charge carriers corresponding to data in a binary logic state; shifting, during a composite operation period, the source line voltage and the bit line voltage to the ground voltage while shifting the word line of the NMOS transistor to a VDD voltage, the shifting step operates on the NMOS transistor and the parasitic bipolar transistor component of the NMOS transistor to activate the word line of the NMOS transistor, wherein the composite operation period being after the first hold period; non-activating, during a bipolar transistor operation period, the word line of the NMOS transistor to the ground voltage while maintaining the source line and the bit line at the ground voltage, the non-activating step operates only on the parasitic bipolar transistor component, wherein the bipolar transistor operation period being after the composite operation period; and precharging, during a second hold period, the source line and the bit line of the NMOS transistor to the precharge voltage while maintaining the word line to the ground voltage, wherein the second hold period performed after the bipolar transistor operation period to hold data at a "0" binary logic state.

Also, there is provided a method of driving a 1-transistor DRAM (Dynamic Random Access Memory) including a NMOS (n-type Metal Oxide Semiconductor) being on top of a SOI (Silicon on Insulator) layer, the NMOS having a parasitic bipolar transistor component, the method including: precharging, during a first hold period, a source line and a bit line of the NMOS of the 1-transistor DRAM at a precharge voltage while non-activating a word line of the NMOS transistor at a ground voltage to maintain an accumulation of charge carriers within a floating channel region underneath a gate of the NMOS transistor wherein the accumulation of charge carriers corresponding to data in a binary logic state; shifting, during a composite operation period, the source line voltage to the ground voltage and the word line of the NMOS transistor to a VCC voltage while maintaining the bit line at the precharge voltage, the shifting step operates on the NMOS transistor and parasitic bipolar transistor component of the NMOS to activate the word line of the NMOS transistor, wherein the composite operation period being after the first hold period; non-activating, during a bipolar transistor operation period, the word line of the NMOS transistor to the ground voltage while maintaining the source line at the ground voltage and while maintaining the bit line at the precharge voltage, wherein the non-activating step operates only on the parasitic bipolar transistor component by non-activating the word line of the NMOS transistor, and wherein the non-activating step being after the composite operation period; and precharging, during a second hold period, the source line of the NMOS transistor to the precharge voltage while maintaining bit line at the precharge voltage and while maintaining the word line at the ground voltage, wherein the second hold period performed after the bipolar transistor operation period so as to write data at a "1" binary logic state.

Also, there is provided a method of driving a 1-transistor DRAM (Dynamic Random Access Memory) including a NMOS (n-type Metal Oxide Semiconductor) being on top of a SOI (Silicon on Insulator) layer, the NMOS having a parasitic bipolar transistor component, the method including: precharging, during a first hold period, a source line and a bit line of the NMOS of the 1-transistor DRAM at a precharge voltage while non-activating a word line of the NMOS transistor at a ground voltage to maintain an accumulation of charge carriers within a floating channel region underneath a gate of the NMOS transistor, wherein the accumulation of charge carriers corresponding to data in a binary logic state; shifting, during a composite operation period, the source line voltage and the bit line voltage to the ground voltage while shifting the word line of the NMOS transistor to a VDD voltage, the shifting step operates on the NMOS transistor and the parasitic bipolar transistor component of the NMOS transistor to activate the word line of the NMOS transistor, wherein the composite operation period being after the first hold period; non-activating, during a bipolar transistor operation period, the word line of the NMOS transistor to a negative voltage relative to the ground voltage while maintaining the source line and the bit line at the ground voltage, the non-activating step operates only on the parasitic bipolar transistor component, wherein the bipolar transistor operation period being after the composite operation period; and precharging, during a second hold period, the source line and the bit line of the NMOS transistor to the precharge voltage while maintaining the word line to the ground voltage, wherein the second hold period performed after the bipolar transistor operation period to hold data at a "0" binary logic state.

Also, there is provided a method of driving a 1-transistor DRAM (Dynamic Random Access Memory) including a NMOS (n-type Metal Oxide Semiconductor) being on top of a SOI (Silicon on Insulator) layer, the NMOS having a parasitic bipolar transistor component, the method including: precharging, during a first hold period, a source line and a bit line of the NMOS of the 1-transistor DRAM at a precharge voltage while non-activating a word line of the NMOS transistor at a ground voltage to maintain an accumulation of charge carriers within a floating channel region underneath a gate of the NMOS transistor wherein the accumulation of charge carriers corresponding to data in a binary logic state; shifting, during a composite operation period, the source line voltage to the ground voltage and the word line of the NMOS transistor to a VCC voltage while maintaining the bit line at the precharge voltage, the shifting step operates on the NMOS transistor and parasitic bipolar transistor component of the NMOS to activate the word line of the NMOS transistor, wherein the composite operation period being after the first hold period; non-activating, during a bipolar transistor operation period, the word line of the NMOS transistor to a negative voltage relative to the ground voltage while maintaining the source line at the ground voltage and while maintaining the bit line at the precharge voltage, wherein the non-activating step operates only on the parasitic bipolar transistor component by non-activating the word line of the NMOS transistor, and wherein the non-activating step being after the composite operation period; and precharging, during a second hold period, the source line of the NMOS transistor to the precharge voltage while maintaining bit line at the precharge voltage and while maintaining the word line at the ground voltage, wherein the second hold period performed after the bipolar transistor operation period so as to write data at a "1" binary logic state.

Also, there is provided a method of driving a 1-transistor DRAM (Dynamic Random Access Memory) including a NMOS (n-type Metal Oxide Semiconductor) being on top of a SOI (Silicon on Insulator) layer, the NMOS having a parasitic bipolar transistor component, the method including: precharging, during a first hold period, a source line and a bit line at a precharge voltage while non-activating a word line of the NMOS transistor at a ground voltage; shifting, during a sense period, the word line and the source line to a sensing word line voltage while maintaining the bit line at the precharge voltage, wherein the sensing word line voltage being lower than the precharge voltage which results in a sensing current flowing between the bit line and the source line, and subsequently detecting the flowing sensing current, wherein the sense period is after the first hold period; and shifting, during a second hold period, the word line to the ground voltage and the source line to the precharging voltage while maintaining the bit line at the precharging voltage which holds an accumulation of charge carriers within a floating channel region underneath a gate of the NMOS which corresponds to data in a binary logic state.

Preferably, in the sense period, the potential difference between the precharge voltage at the bit line and sensing word line voltage at the source line is about 0.2V.

The present invention has an effect of an improved write operation margin by performing an write operation in a state where a large amount of hole carrier is generated.

DESCRIPTION OF SPECIFIC EMBODIMENTS

A 1-transistor floating body type DRAM according to the present invention is configured using a NMOS transistor component that has a parasitic NPN bipolar transistor component. In the parasitic NPN bipolar transistor component, the floating body of the NMOS forms the base, the source line SL of the NMOS forms the emitter, and the bit line BL of the NMOS forms the collector.

Since data of a cell is not destroyed when reading the data in a non destructive read out (NDRO) manner, the 1-transistor floating body type DRAM according to the present invention can improve reliability of the cell and increase read speed of the data. And, since a large amount of hole carrier can be captured in the floating body, the 1-transistor floating body type DRAM according to the present invention can improve the performance of a write operation margin of the data.

A first embodiment of a write method of the present invention will be described with reference to FIGS. 4 and 5.

Figure 1:
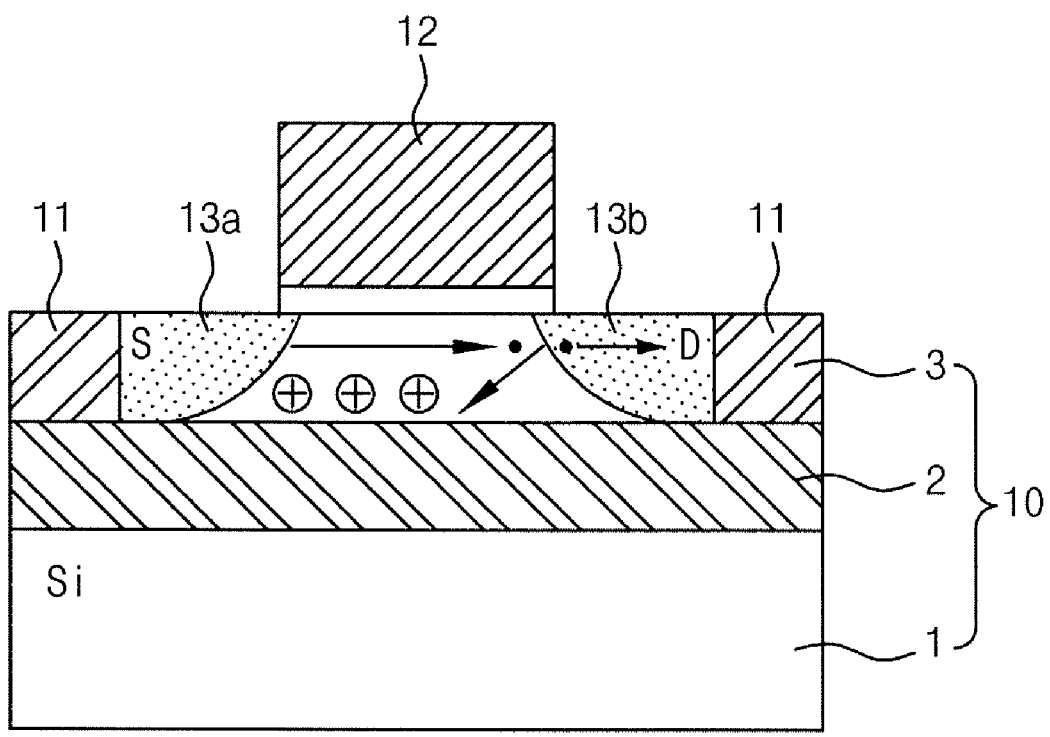
FIG. 1 is a cross-sectional view showing a floating body cell of a conventional SOI structure.
Figure 2A:
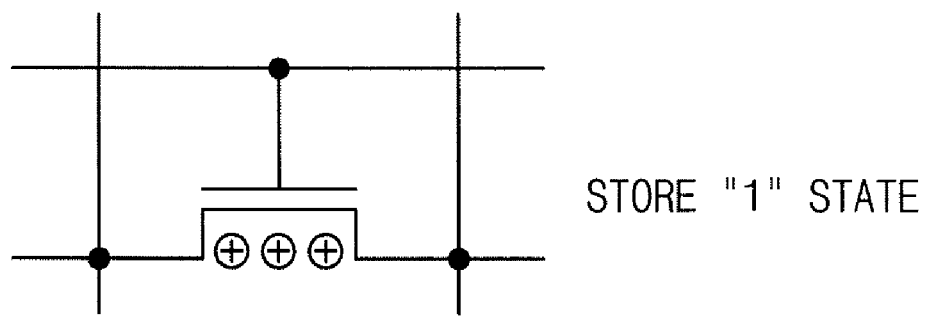
FIGS. 2a and 2b are circuit views explaining a data store state of a conventional 1-transistor type floating body cell.
Figure 2B:
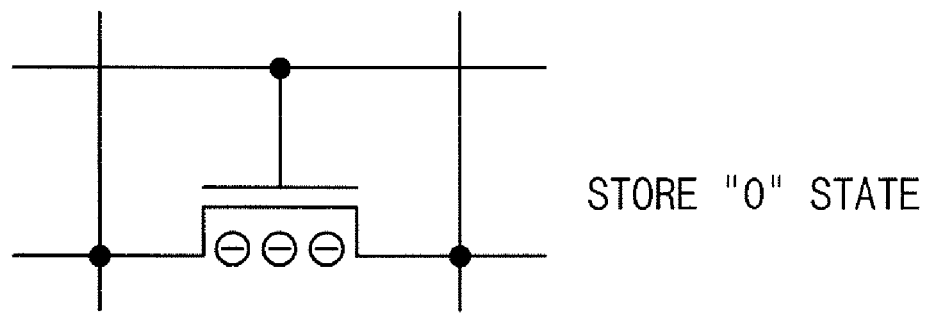
Figure 3:
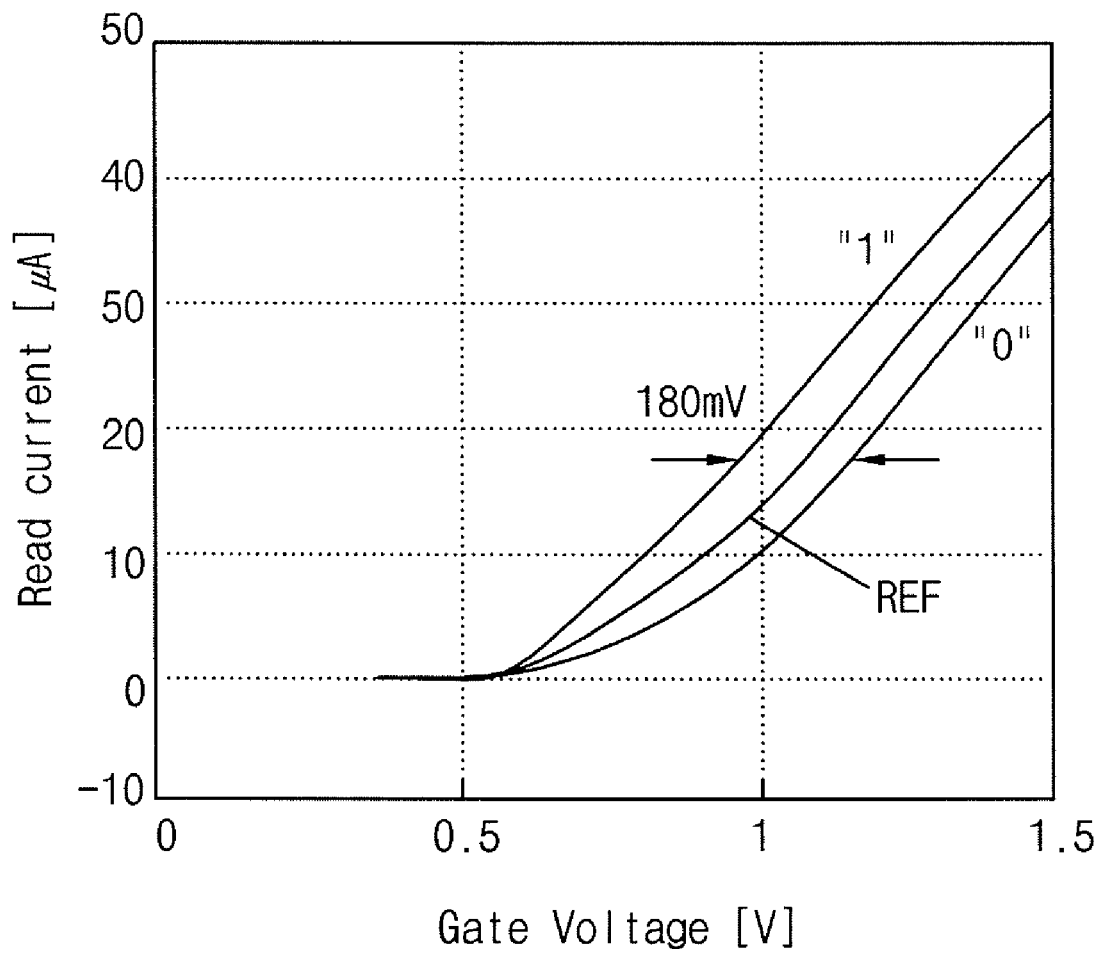
FIG. 3 is a graph representing cell read current of FIGS. 2a and 2b.
Figure 4A:
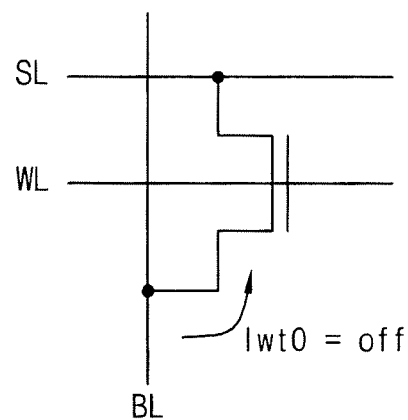
FIGS. 4a and 4b are a circuit view and a waveform view explaining a data "0" write according to a first embodiment of a 1-transistor type DRAM driving method of the present invention.
Figure 4B:
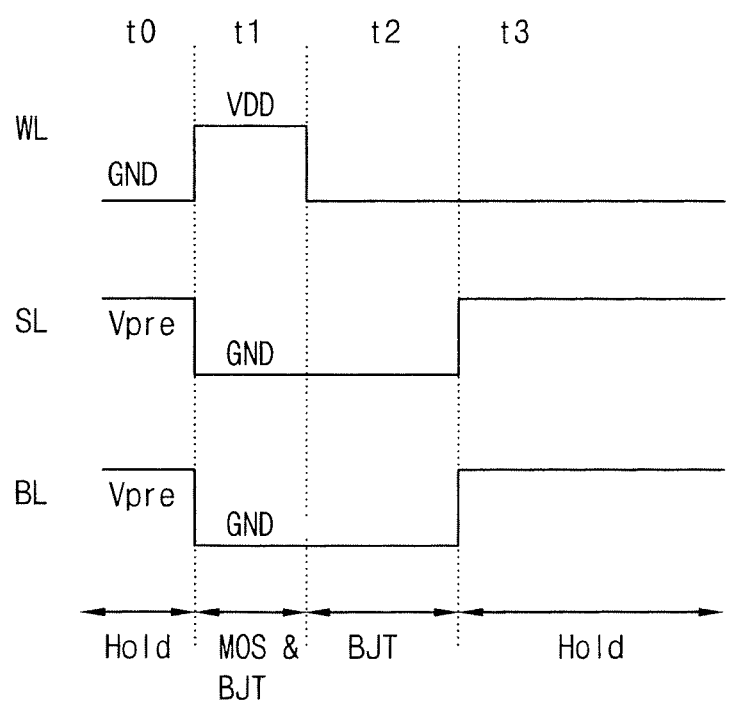

A write "0" method according to the first embodiment of the present invention will be described with reference to FIGS. 4a and 4b.

For the write "0" according to the first embodiment, a DRAM is operated by being divided into t0, t1, t2, and t3 periods.

t0 and t3 periods, which are a hold period, become a data sustain period.

A t1 period is a complex operation period involving the NMOS and the parasitic BJT, wherein the word line WL voltage is turned on to be high level voltage to operate NMOS transistor component when writing data in the cell.

Also, in the t1 period, source line SL voltage is shifted from precharge voltage Vpre to ground voltage GND so that forward voltage is biased between a P-type semiconductor floating body of the NMOS transistor and an N-type semiconductor of the source line SL thereof and thereby, the parasitic bipolar transistor starts to operate. However, the bit line BL voltage and the source line SL are together shifted to the ground voltage GND so that a data "0" write current Iwt0 becomes a turn-off state.

A t2 period is a bipolar transistor operation period BJT, wherein the word line WL voltage is shifted back to GND voltage so that only the parasitic bipolar transistor BJT operates. In the data "0" write state, the bit line BL voltage and the source line SL are together shifted to the ground voltage GND so that the data "0" write current Iwt0 becomes "0" to be a turn-off state. Therefore, a large amount of hole charge remaining in the floating body is discharged into the bit line BL and the source line SL.

Figure 5A:
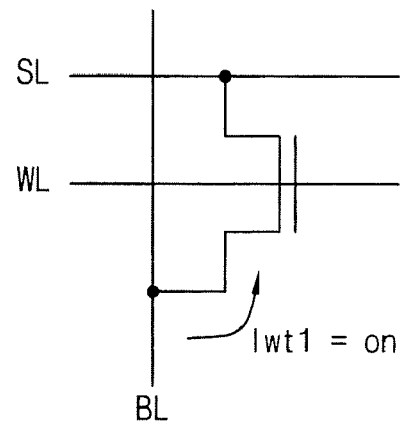
FIGS. 5a and 5b are a circuit view and a waveform view explaining a data "1" write according to a first embodiment of a 1-transistor type DRAM driving method of the present invention.
Figure 5B:
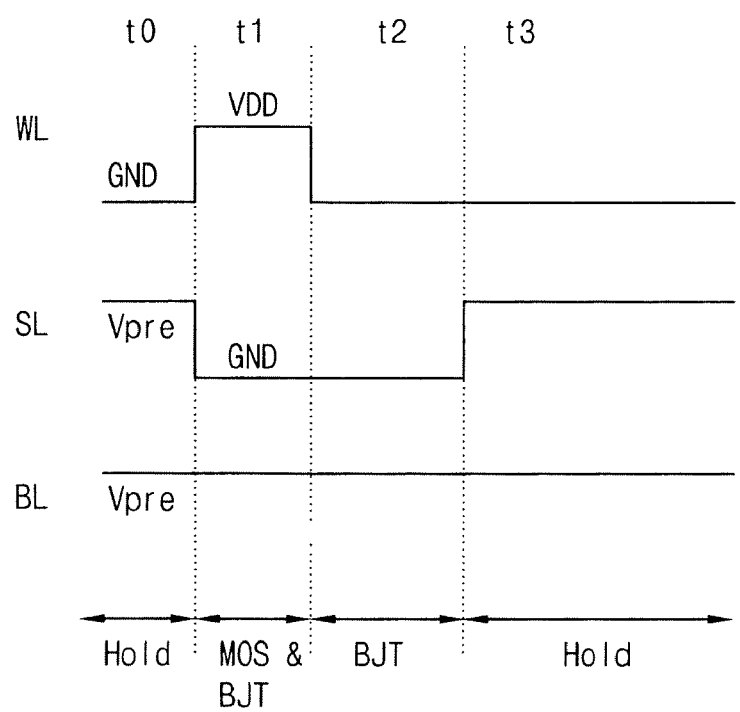

A write "1" method according to a second embodiment of the present invention will be described with reference to FIGS. 5a and 5b.

For the write "1" according to the first embodiment, a DRAM is operated by being divided into t0, t1, t2, and t3 periods.

t0 and t3 periods, which are hold periods, become a data sustain period.

A t1 period is a complex operation period involving the NMOS and the parasitic BJT, wherein the word line WL voltage is turned on to be high to perform an NMOS transistor operation when writing data in the cell.

Also, in the t1 period, the source line SL voltage is shifted from precharge voltage Vpre to ground voltage GND so that forward voltage is biased between the P-type semiconductor floating body of the NMOS transistor and the N-type semiconductor of the source line SL thereof and thereby, the parasitic bipolar transistor starts to operate. However, the bit line BL voltage continually holds the precharge voltage Vpre so that a data "1" write current Iwt1 becomes a turn-on state.

A t2 period is a bipolar transistor BJT operation period, wherein the word line WL voltage is shifted back to GND voltage so that only the parasitic bipolar transistor BJT operates. In the data "1" write, the bit line BL voltage continually holds the precharge voltage Vpre so that the operation of the parasitic bipolar transistor operation BJT is continually valid and thereby, the data "1" write current Iwt1 continually holds a turn-on state. Therefore, the potential of the floating body rises to a high value due to the generation of a large accumulation of hole carriers.

Figure 6A:
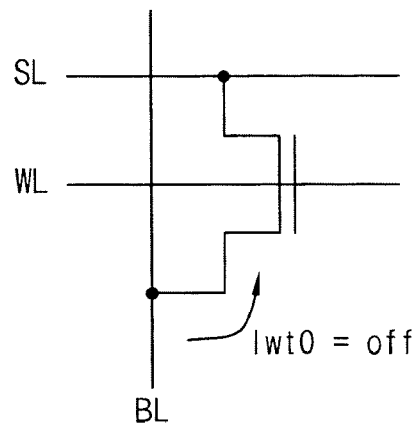
FIGS. 6a and 6b are a circuit view and a waveform view explaining a data "0" write according to a second embodiment of a 1-transistor type DRAM driving method of the present invention.
Figure 6B:
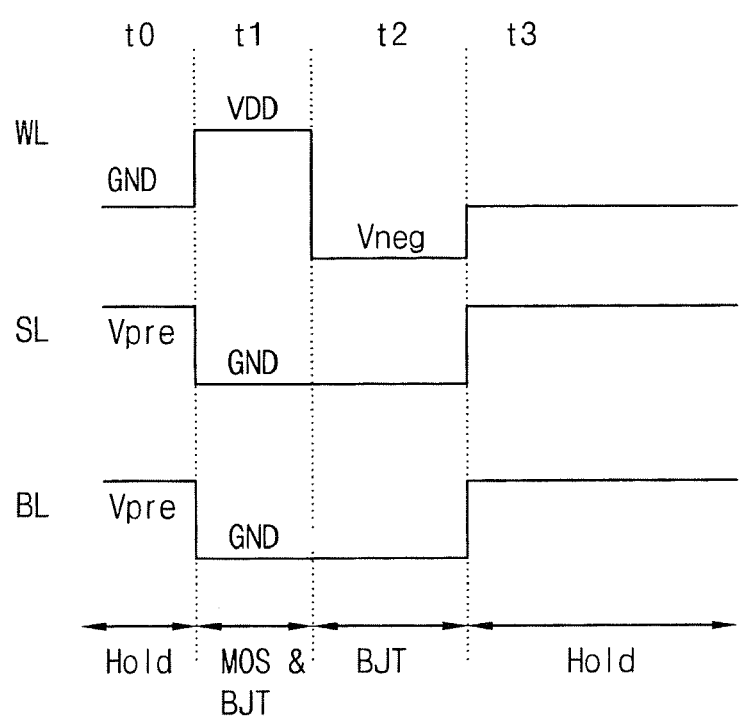
Figure 7A:
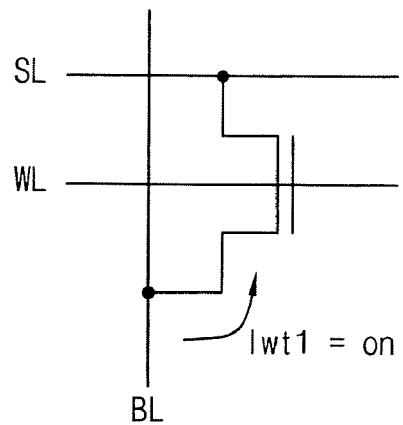
FIGS. 7a and 7b are a circuit view and a waveform view explaining a data "1" write according to a second embodiment of a 1-transistor type DRAM driving method of the present invention.
Figure 7B:
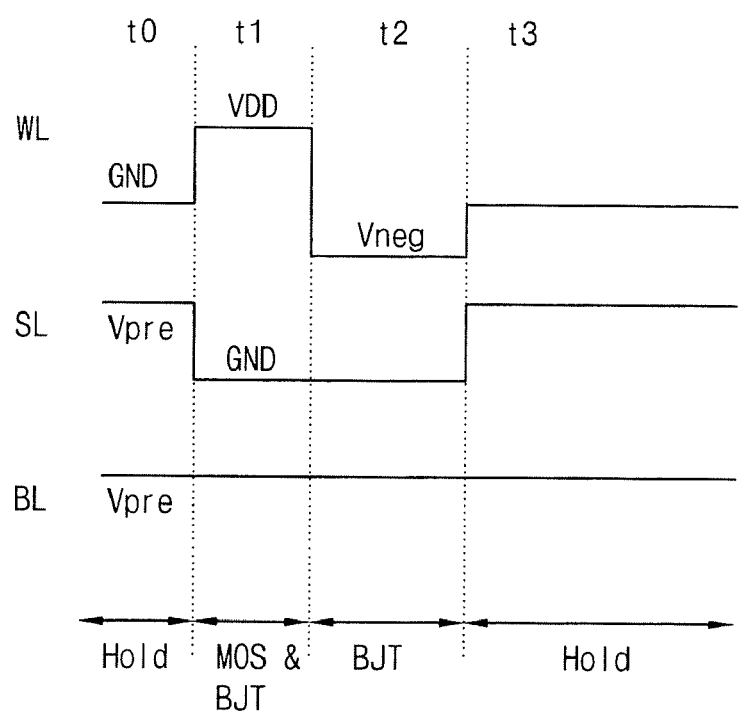

A write "1" method according to a second embodiment of the present invention will be described with reference to FIGS. 6 and 7.

A write "0" method according to the second embodiment of the present invention will be described with reference to FIGS. 6a and 6b.

For the write "0" method according to the second embodiment, a DRAM is operated by being divided into t0, t1, t2, and t3 periods.

t0 and t3 periods, which are a hold period, become a data sustain period.

A t1 period is a complex operation period involving the NMOS and the parasitic BJT, wherein the word line WL voltage is turned on to be high to perform an NMOS transistor operation when writing data in the cell.

Also, in the t1 period, the source line SL voltage is shifted from precharge voltage Vpre to the ground voltage GND so that forward voltage is biased between the P-type semiconductor floating body of the NMOS transistor and the N-type semiconductor of the source line SL thereof and thereby, the parasitic bipolar transistor starts to operate.

However, the bit line BL voltage and the source line SL voltage are shifted together to the ground voltage GND so that data "0" write current Iwt0 becomes a turn-off state.

A t2 period is a bipolar transistor BJT operation period, wherein the word line WL voltage is shifted to a negative voltage relative to ground so that only the parasitic bipolar transistor BJT operates. In the data "0" write, the bit line BL voltage and the source lines SL voltage are together shifted to the ground voltage GND so that a data "0" write current IwtO becomes 0 to be a turned-off state. Therefore, a large accumulation of hole charge carriers remaining in the floating body is discharged into the bit line BL and the source line SL.

A first embodiment of a write "1" method of the present invention will be described with reference to FIGS. 6a and 6b.

For the write "1" according to the second embodiment, a DRAM is operated by being divided into t0, t1, t2, and t3 periods.

t0 and t3 periods, which are a hold period, become a data sustain period.

A t1 period is a complex operation period involving the NMOS and the parasitic BJT, wherein the word line WL voltage is turned on to be at a high level voltage to perform NMOS transistor operation when writing data in the cell.

Also, in the t1 period, source line SL voltage is shifted from precharge voltage Vpre to ground voltage GND so that forward voltage is biased between the P-type semiconductor floating body of the NMOS transistor and the N-type semiconductor of the source line SL thereof and thereby, the parasitic bipolar transistor starts to operate.

However, the bit line BL voltage continually holds the precharge voltage Vpre so that a data "1" write current Iwt1 becomes a turn-on state.

A t2 period is a bipolar transistor operation period BJT, wherein the word line WL voltage is shifted to negative voltage Vneg so that only the parasitic bipolar transistor BJT operates.

A large accumulation of hole carriers can be captured in the floating body by shifting the word line WL voltage to the negative voltage Vneg, making it possible to improve a write operation margin of the data "1". In the data "1" write, the bit line BL voltage continually holds the precharge voltage Vpre so that the operation of the parasitic bipolar transistor BJT is continually valid, thereby continually holding the data "1" write current Iwt1 in a turn-on state.

Therefore, floating body potential rises to a high value due to the generation of a large accumulation of hole carriers.

Figure 8A:
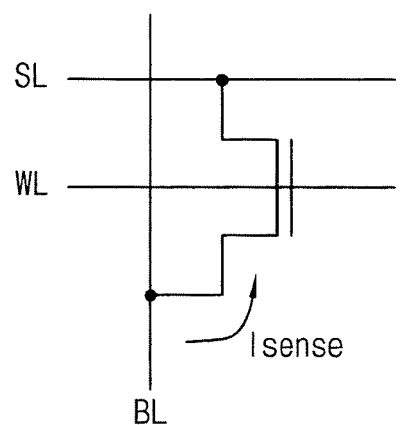
FIGS. 8a and 8b are a circuit view and a waveform view explaining a read method according to a 1-transistor type DRAM driving method of the present invention.
Figure 8B:
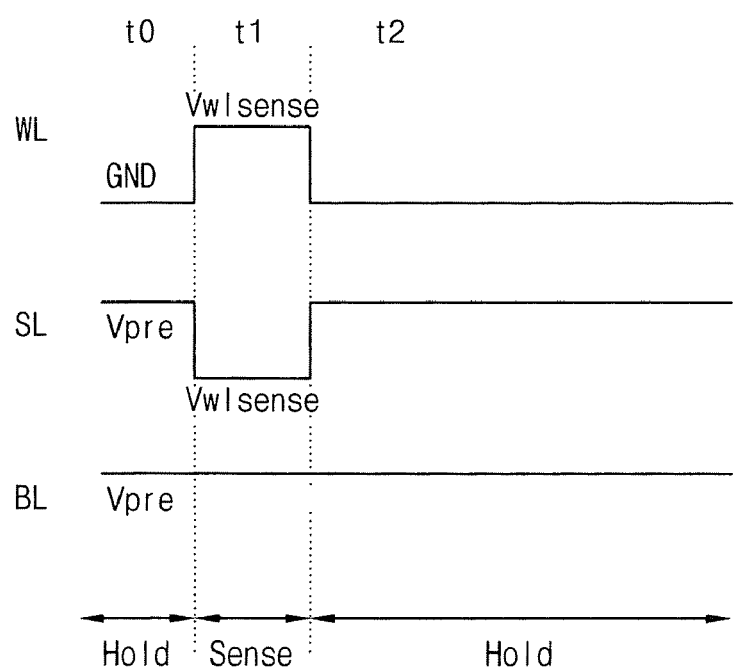

A read method according to the present invention will be described with reference to FIG. 8.

t0 and t2 periods, which are a hold period, are a data sustain period.

A t1 period is a sense period, wherein word line WL voltage rises to sensing word line voltage Vwlsense from ground voltage VDD. The sensing word line voltage Vwlsense is a voltage for sensing sense current Isense flowing from a bit line BL to a source line SL. The source line SL is applied with sensing source line voltage Vslsense lower than precharge voltage Vpre. At this time, voltage of less than 0.2V is applied between the bit line BL and the source line SL. The bit line BL is fixed to precharge voltage Vpre.

Figure 9:
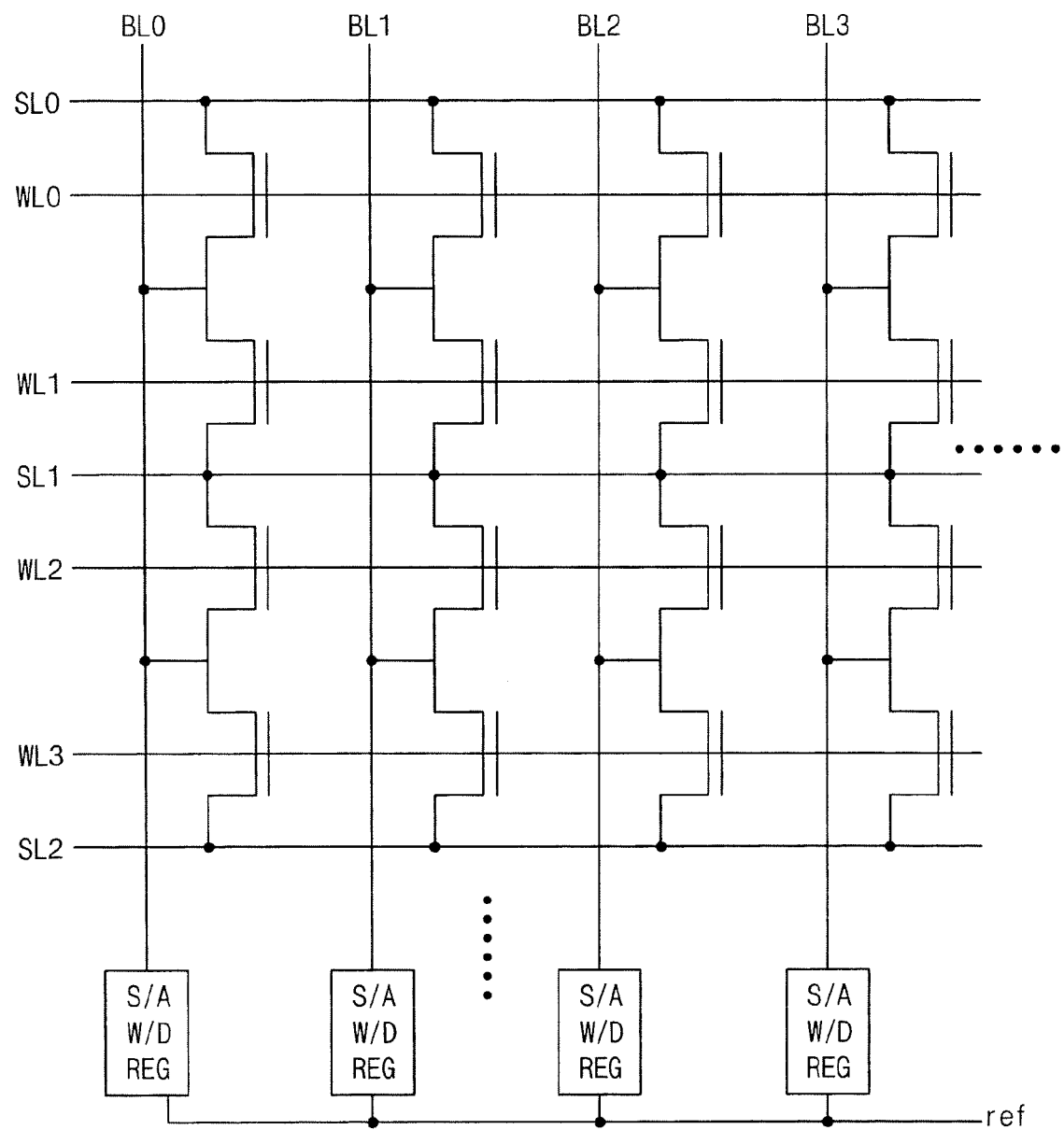
FIG. 9 is a circuit view showing a cell array structure to which the embodiments of the present invention are applied.

The DRAM according to the present invention, performing write/read operations as described above, has a cell array structure as shown in FIG. 9.

Cells of the cell array in a column direction share each bit line BL0, BL1, BL2, BL3 by two unit cells, and cells thereof in a row direction share each source line SL0, SL1, SL2 and each word line WL0, WL1, WL2 to a source and a gate.

Each bit line BL is connected to a sense amp S/A, a write driver W/D, and a register block REG, wherein each sense amp S/A, write driver W/D, and register block REG is supplied with reference voltage ref.

Herein, the sense amp S/A, the write driver W/D, and the register block REG include a sense amp S/A, a write driver W/D, and a register block REG. The sense amp S/A senses cell data to perform an operation to distinguish Data 1 and Data 0. The register REG is a temporary memory apparatus circuit for temporarily storing data of the sense amp S/A. And, the write driver W/D is a circuit for generating driving voltage in the bit line BL in accordance with write data when writing data in the cell.

Figure 10:
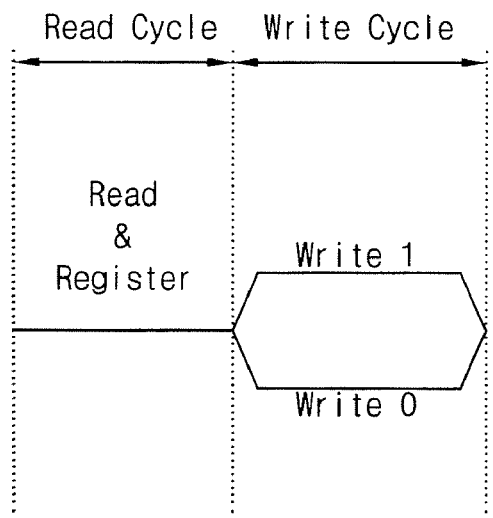
FIG. 10 is a cycle waveform view showing a write method according to the embodiments of the present invention.

Describing a cycle of a write operation according to the present invention with reference to FIG. 10, the write operation includes a read cycle and a write cycle.

Cell data for all the cells in a row direction selected in the read cycle period is sensed and amplified to be stored in the register.

In the write cycle period, the data stored in the register in the read cycle is written again to be restored. If new data is written, the new data is stored in the register and external data newly stored is written in the cell.

Figure 11:
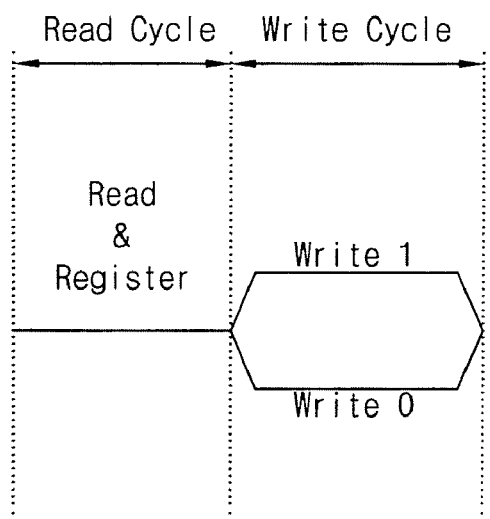
FIG. 11 is a cycle waveform view representing a refresh method according to the embodiments of the present invention.

Describing a cycle of a refresh operation according to the present invention with reference to FIG. 11, the refresh operation includes a read cycle and a write cycle.

Cell data for all the cells in a row direction selected in the read cycle period is sensed and amplified to be stored in the register.

In the write cycle period, the data stored in the register in the read cycle is written again to be restored.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A method of driving a 1-transistor DRAM including an NMOS being on top of a SOI layer, the NMOS having a parasitic bipolar transistor component, the method including:
   precharging, during a first hold period, a source line and a bit line of the NMOS of the 1-transistor DRAM at a precharge voltage while deactivating a word line of the NMOS transistor at a ground voltage to maintain an accumulation of charge carriers within a floating channel region underneath a gate of the NMOS transistor, wherein the accumulation of charge carriers corresponding to data in a binary logic state;
   shifting, during a composite operation period, the source line voltage and the bit line voltage to the ground voltage while shifting the word line of the NMOS transistor to a VDD voltage, the shifting step operates on the NMOS transistor and the parasitic bipolar transistor component of the NMOS transistor to activate the word line of the NMOS transistor, wherein the composite operation period being after the first hold period;
   deactivating, during a bipolar transistor operation period, the word line of the NMOS transistor to the ground voltage while maintaining the source line and the bit line at the ground voltage, the deactivating step operates only on the parasitic bipolar transistor component, wherein the bipolar transistor operation period being after the composite operation period; and
   precharging, during a second hold period, the source line and the bit line of the NMOS transistor to the precharge voltage while maintaining the word line to the ground voltage, wherein the second hold period performed after the bipolar transistor operation period to hold data at a "0" binary logic state.

2. A method of driving a 1-transistor DRAM including a NMOS being on top of a SOI layer, the NMOS having a parasitic bipolar transistor component, the method including:
   precharging, during a first hold period, a source line and a bit line of the NMOS of the 1-transistor DRAM at a precharge voltage while deactivating a word line of the NMOS transistor at a ground voltage to maintain an accumulation of charge carriers within a floating channel region underneath a gate of the NMOS transistor wherein the accumulation of charge carriers corresponding to data in a binary logic state;
   shifting, during a composite operation period, the source line voltage to the ground voltage and the word line of the NMOS transistor to a VCC voltage while maintaining the bit line at the precharge voltage, the shifting step operates on the NMOS transistor and parasitic bipolar transistor component of the NMOS to activate the word line of the NMOS transistor, wherein the composite operation period being after the first hold period;

deactivating, during a bipolar transistor operation period, the word line of the NMOS transistor to the ground voltage while maintaining the source line at the ground voltage and while maintaining the bit line at the precharge voltage, wherein the deactivating step operates only on the parasitic bipolar transistor component by deactivating the word line of the NMOS transistor, and wherein the deactivating step being after the composite operation period; and precharging, during a second hold period, the source line of the NMOS transistor to the precharge voltage while maintaining bit line at the precharge voltage and while maintaining the word line at the ground voltage, wherein the second hold period performed after the bipolar transistor operation period so as to write data at a "1" binary logic state.

3. A method of driving a 1-transistor DRAM including a NMOS being on top of a SOI layer, the NMOS having a parasitic bipolar transistor component, the method including:

precharging, during a first hold period, a source line and a bit line of the NMOS of the 1-transistor DRAM at a precharge voltage while deactivating a word line of the NMOS transistor at a ground voltage to maintain an accumulation of charge carriers within a floating channel region underneath a gate of the NMOS transistor, wherein the accumulation of charge carriers corresponding to data in a binary logic state;

shifting, during a composite operation period, the source line voltage and the bit line voltage to the ground voltage while shifting the word line of the NMOS transistor to a VDD voltage, the shifting step operates on the NMOS transistor and the parasitic bipolar transistor component of the NMOS transistor to activate the word line of the NMOS transistor, wherein the composite operation period being after the first hold period;

deactivating, during a bipolar transistor operation period, the word line of the NMOS transistor to a negative voltage relative to the ground voltage while maintaining the source line and the bit line at the ground voltage, the deactivating step operates only on the parasitic bipolar transistor component, wherein the bipolar transistor operation period being after the composite operation period; and precharging, during a second hold period, the source line and the bit line of the NMOS transistor to the precharge voltage while maintaining the word line to the ground voltage, wherein the second hold period performed after the bipolar transistor operation period to hold data at a "0" binary logic state.

4. A method of driving a 1-transistor DRAM including a NMOS being on top of a SOI layer, the NMOS having a parasitic bipolar transistor component, the method including:

precharging, during a first hold period, a source line and a bit line of the NMOS of the 1-transistor DRAM at a precharge voltage while deactivating a word line of the NMOS transistor at a ground voltage to maintain an accumulation of charge carriers within a floating channel region underneath a gate of the NMOS transistor wherein the accumulation of charge carriers corresponding to data in a binary logic state;

shifting, during a composite operation period, the source line voltage to the ground voltage and the word line of the NMOS transistor to a VCC voltage while maintaining the bit line at the precharge voltage, the shifting step operates on the NMOS transistor and parasitic bipolar transistor component of the NMOS to activate the word line of the NMOS transistor, wherein the composite operation period being after the first hold period;

deactivating, during a bipolar transistor operation period, the word line of the NMOS transistor to a negative voltage relative to the ground voltage while maintaining the source line at the ground voltage and while maintaining the bit line at the precharge voltage, wherein the deactivating step operates only on the parasitic bipolar transistor component by deactivating the word line of the NMOS transistor, and wherein the deactivating step being after the composite operation period; and precharging, during a second hold period, the source line of the NMOS transistor to the precharge voltage while maintaining bit line at the precharge voltage and while maintaining the word line at the ground voltage, wherein the second hold period performed after the bipolar transistor operation period so as to write data at a "1" binary logic state.

5. A method of driving a 1-transistor DRAM including a NMOS being on top of a SOI layer, the NMOS having a parasitic bipolar transistor component, the method including:

precharging, during a first hold period, a source line and a bit line at a precharge voltage while deactivating a word line of the NMOS transistor at a ground voltage;

shifting, during a sense period, the word line and the source line to a sensing word line voltage while maintaining the bit line at the precharge voltage, wherein the sensing word line voltage being lower than the precharge voltage which results in a sensing current flowing between the bit line and the source line, and subsequently detecting the flowing sensing current, wherein the sense period is after the first hold period; and shifting, during a second hold period, the word line to the ground voltage and the source line to the precharging voltage while maintaining the bit line at the precharging voltage which holds an accumulation of charge carriers within a floating channel region underneath a gate of the NMOS which corresponds to data in a binary logic state.

6. The 1-transistor type DRAM driving method as set forth in claim 5, wherein in the sense period, the potential difference between the precharge voltage at the bit line and sensing word line voltage at the source line is about 0.2V.

* * * * *